US008077440B2

(12) United States Patent
Krabbenborg et al.

(10) Patent No.: US 8,077,440 B2
(45) Date of Patent: Dec. 13, 2011

(54) ESD PROTECTION CIRCUIT

(75) Inventors: Bernardus Henricus Krabbenborg, Arnhem (NL); Marco Berkhout, Tiel (NL); Johannes Van Zwol, Beek-Ubbergen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/663,287

(22) PCT Filed: Jun. 18, 2008

(86) PCT No.: PCT/IB2008/052397
§ 371 (c)(1),
(2), (4) Date: May 19, 2010

(87) PCT Pub. No.: WO2008/155729
PCT Pub. Date: Dec. 24, 2008

(65) Prior Publication Data
US 2010/0220419 A1 Sep. 2, 2010

(30) Foreign Application Priority Data

Jun. 21, 2007 (EP) .................................. 07110776

(51) Int. Cl.
H02H 9/00 (2006.01)
H02H 3/22 (2006.01)
(52) U.S. Cl. .......................................... 361/56; 361/111
(58) Field of Classification Search .................. 361/154, 361/56, 111
See application file for complete search history.

(56) References Cited

U.S. PATENT DOCUMENTS

| 6,064,249 A | 5/2000 | Duvvury et al. |
| 6,577,480 B1 * | 6/2003 | Avery et al. ...................... 361/56 |
| 6,614,633 B1 | 9/2003 | Kohno |
| 2005/0225912 A1 | 10/2005 | Pant et al. |
| 2008/0116519 A1 | 5/2008 | Wilkening |

FOREIGN PATENT DOCUMENTS

| DE | 10 2004 050767 A1 | 4/2006 |
| WO | 01/11749 A1 | 2/2001 |
| WO | 2005040211 A | 4/2006 |
| WO | 2006040211 A | 4/2006 |

OTHER PUBLICATIONS

Feng, Haigang, et al; "An ESD Protection Circuit for Mixed Signal ICS"; IEEE Custom Integrated Circuits Conference (2001); pp. 493-496.
International Search Report for Int'l Appln. PCT/IB2008/052397 (Sep. 17, 2008).

* cited by examiner

Primary Examiner — Jared Fureman
Assistant Examiner — Lucy Thomas

(57) ABSTRACT

An ESD protection circuit comprises a first supply line ($V_{DD}$), a second supply line ($V_{SS}$), an ESD protection device, preferably being configured as a transistor ($M_P$), which is connected between the first and second supply line ($V_{DD}$, $V_{SS}$) and at least one pin ($V_A$) connected to the first and second supply lines ($V_{DD}$, $V_{SS}$) via diodes D1, D2. The ESD protection device is controllable by a trigger voltage that is set by a trigger voltage setting circuit ($R_P$, $R_D$, Z1, Z2, Z3). The ESD protection circuit comprises a trigger circuit (1) being connected to the at least one pin ($V_A$) and providing pin specific trigger voltages, wherein the trigger circuit (1) is further connected to the trigger voltage setting circuit.

9 Claims, 11 Drawing Sheets

ESD PROTECTION CIRCUIT

The invention relates to a circuit comprising a first supply line, a second supply line and a voltage dependant controllable ESD protection device, preferably being configured as a transistor being connected between the first and second supply line as well as at least one further pin.

An Electro Static Discharge (ESD) protection circuit is an important part of any integrated circuit that protects the rest of the circuit against high voltages that may appear during an ESD event. The task of the protection circuit is to lead the discharge current through a path that is especially designed to handle the high current levels during such an event. The resulting voltage between the two pins that are stressed must be lower than the breakdown voltages of the transistors that are also connected to these pins.

In most processes, special ESD protection devices are developed to be used in such a circuit. These devices usually have a snapback behavior in their current-voltage characteristics. A common ESD protection device T1 is a grounded-gate NMOS transistor like illustrated in FIG. 1A.

In case a current I is forced through the ESD protection device T1, the voltage V will first increase up to the trigger voltage $V_{TRIGGER}$ and will then drop to $V_{HOLD}$ when the device enters a low ohmic region in which high currents can be conducted, as shown in the current-voltage characteristic of FIG. 1B. In normal operation of the product, the voltage across the ESD protection device T1 must never exceed the hold voltage $V_{HOLD}$, so that the low ohmic, high current mode can only be entered during ESD events. The breakdown voltage of all devices connected to the pins must always be higher than the trigger voltage $V_{TRIGGER}$ of the ESD protection device T1, since that is the voltage that will be present during an ESD event.

In general there are two strategies for ESD protection circuits that are often combined:

One strategy is supply rail based protection circuit (see FIG. 2). Here all pins $V_A$, $V_B$ are connected to the supply lines $V_{DD}$, $V_{SS}$ with diodes D1, D2, D3, D4. Next, there is a central ESD protection device T1 between the supply lines $V_{DD}$, $V_{SS}$. During an ESD event when a current $I_E$ is forced from one pin $V_A$ to another $V_B$, the current $I_E$ will flow from the first pin $V_A$ through the diode D3 to supply line $V_{DD}$, through the protection device T1 and through the diode D2 to the second pin $V_B$. The resulting hold voltage between all sets of two pins $V_A$, $V_B$ protected this way is now equal to the hold voltage of the ESD protection device T1 plus two forward diode voltages.

The other strategy is a pin specific protection (see FIG. 3). In this circuit a pin $V_A$ is not (only) connected to the supply lines $V_{DD}$, $V_{SS}$ with diodes, but (also) with an ESD protection device T3. This can be done if the pin $V_A$ requires a pin-specific trigger and hold voltage level lower than the trigger and hold voltage of the ESD protection elements T1, T2 between the supply lines $V_{DD}$, $V_{SS}$ of the supply rail based protection circuit.

As shown in FIG. 3, if hold and trigger voltages are required that are higher than the hold and trigger voltages of a single ESD protection device T1, a stack of such ESD protection devices T1, T2 can be used. Alternatively, an active clamp circuit can be used. This may be triggered by voltage, or also capacitively.

For an economically optimal circuit the breakdown voltage of all components is as close as possible to the maximum supply voltage (since any overhead in voltage capabilities is paid with silicon area). To prevent damage during an ESD event the breakdown voltage must always be higher than the trigger voltage (and hold voltage) of the ESD protection circuit: $V_{SUPPLY,MAX} < V_{HOLD} < V_{TRIGGER} < BV_{DS}$, so-called ESD design margin.

This means that the difference between maximum supply voltage and ESD hold voltage should be kept as low as possible and the difference between the breakdown voltage of the circuit components and the trigger voltage of the ESD protection circuit should be kept as low as possible and the difference between trigger voltage and hold voltage of the ESD protection circuit should be as low as possible.

In case the standard snapback-based ESD protection devices are used, the required trigger and hold voltages must be created by stacking such protection elements until the resulting hold voltage is above the maximum supply voltage. The resulting trigger voltage then determines the required breakdown voltage $BV_{DS}$ of the components. It will be clear that the difference between trigger and hold voltage increases the required BVDS. This is especially unfavorable if the number of protection devices in the stack is high. For a stack of N ESD protection devices this gives an additional voltage margin of $N*(V_{TRIGGER}-V_{HOLD})$. Usually there are only a few types (with respect to the hold voltage) of ESD protection devices available, so that additional voltage margins appear. Also, usually there are only a few types of transistors available with respect to $BV_{DS}$. This also leads to additional voltage margins as shown look at the following example:

ESD protection devices available with $V_{HOLD}=12V$, $V_{TRIGGER}=17V$

Transistors available with $BV_{DS}=12V$, 24V, 60V, and 120V.

Maximum supply voltage=38V

A stack of 4 ESD protection devices is required that gives $V_{HOLD,STACK}=48V$ and $V_{TRIGGER,STACK}=68V$.

Now $BV_{DS}$ must be higher than 68V, which means that 120V devices are required for a 38V application. Designing a non-standard HV transistor with BV around 80V would be an alternative, but requires a considerable qualification effort, which makes short time-to market impossible.

Active clamp circuits use an ordinary transistor to conduct the ESD current. To sink the several Amperes of current that flow in a discharge event, the width of this transistor is typically several mm. Active clamps with trigger circuits built from predictable, well modeled circuit elements do not suffer from the voltage margin issue discussed above for snapback stacks. However, in particular for High Voltage active clamps, the area consumption is considerable, which makes them unattractive for smaller ICs. If the IC contains multiple voltage ranges, each voltage range needs its own active clamp, which further increases the area consumption.

It is an object of the invention to provide an ESD protection circuit of the type defined in the opening paragraph, in which the disadvantages defined above are avoided.

In order to achieve the object defined above, with an ESD protection circuit according to the invention characteristic features are provided so that an ESD protection circuit according to the invention can be characterized in the way defined below, that is:

An ESD protection circuit comprising a first supply line, a second supply line, an ESD protection device, preferably being configured as a transistor, which is connected between the first and second supply line and at least one pin being connected to the first and second supply lines via diodes, wherein the ESD protection device is controllable by a trigger voltage that is set by a trigger voltage setting circuit, wherein the ESD protection circuit comprises a trigger circuit being connected to the at least one pin and providing pin specific trigger voltages, wherein the trigger circuit is further connected to the trigger voltage setting circuit.

By providing an ESD protection circuit with a single, voltage triggered active clamp which is triggered by a trigger circuit that has multiple trigger voltages—dependent on the pins involved in the ESD event—the clamp voltage can be accurately matched to the maximum supply voltage without the disadvantages of the difference between trigger and hold voltage and the stepwise accuracy of stacking protection devices for higher voltages. Especially if the circuit is combined with transistors with scalable drift region that results in scalable breakdown voltages $BV_{DS}$ and resistances $R_{DS,ON}$, an effective ESD protection circuit is obtained with minimum possible breakdown voltages $BV_{DS}$ for the transistors and thus with minimum circuit area.

The trigger circuit is built from predictable, well-modeled circuit elements, particularly those being defined in the subclaims.

By building the trigger circuit with electronic switching devices connected in parallel to portions of the trigger voltage setting circuit said circuit portions are bypassed when the electronic switching devices are switched on. The voltage that is necessary to switch on the electronic switching devices may be individually designed for each pin. Multiple trigger voltages may easily be achieved by using zener diodes in the trigger circuit, particularly in paths of the trigger circuit that serve to bypass portions of the trigger voltage setting circuit.

The aspects defined above and further aspects of the invention are apparent from the exemplary embodiment to be described hereinafter and are explained with reference to this exemplary embodiment.

The invention will be described in more detail hereinafter with reference to an exemplary embodiment. However, the invention is not limited to this exemplary embodiment.

Figure 1A:
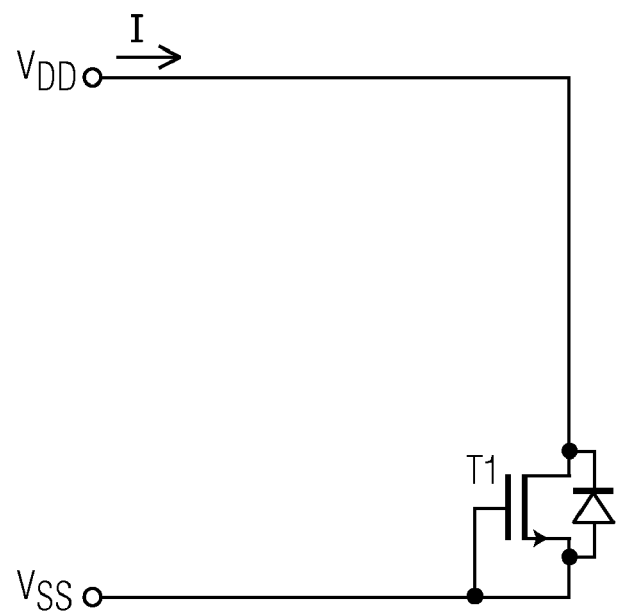
FIG. 1A shows a schematic circuit of a typical ESD protection device.
Figure 1B:
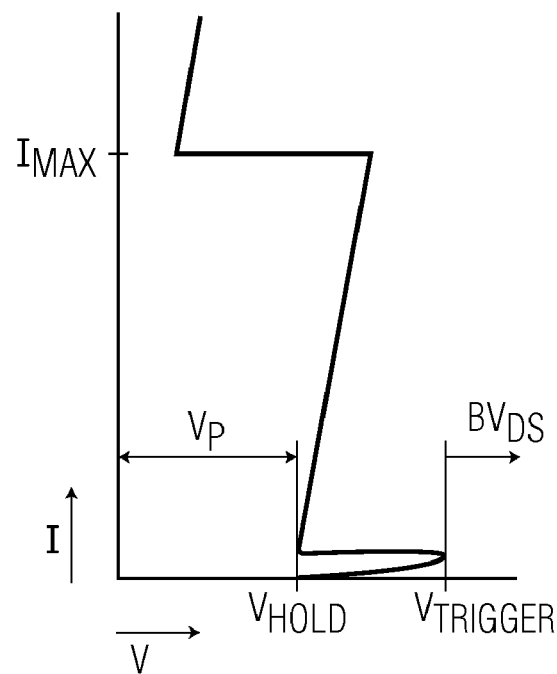
FIG. 1B shows an I-V characteristic for the circuit of FIG. 1A where $I_{MAX}$ is the maximum current level at which $2^{nd}$ breakdown occurs.
Figure 2:
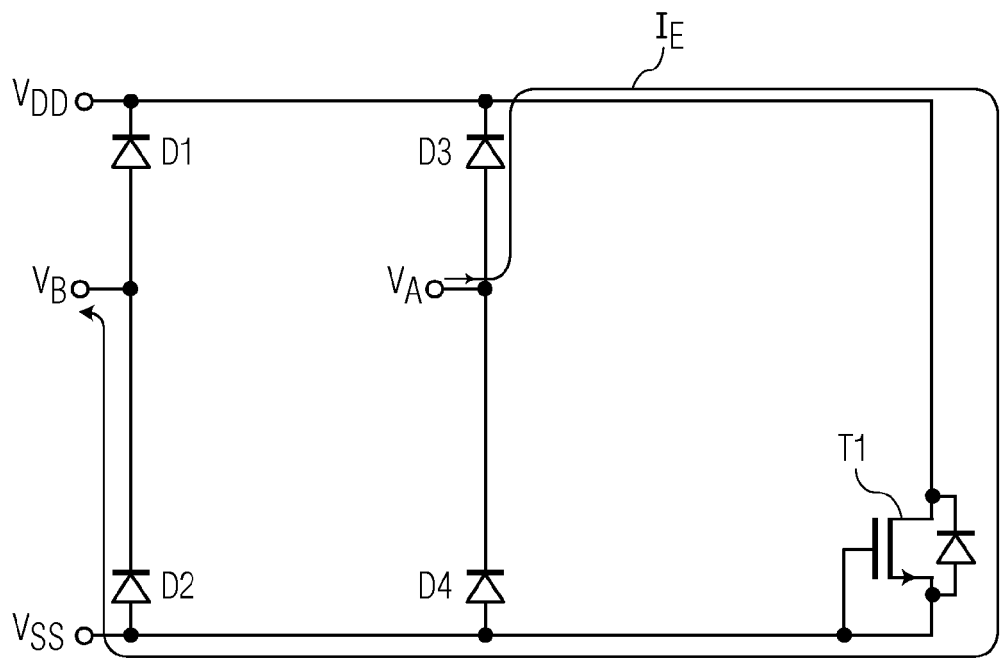
FIG. 2 shows a schematic circuit of a supply rail based protection circuit.
Figure 3:
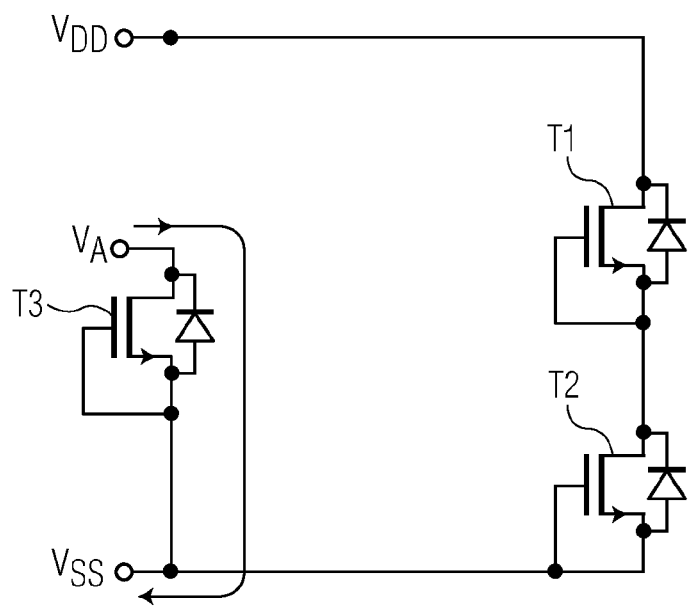
FIG. 3 shows a schematic circuit of a pin specific protection circuit. In this example, the supply rail is protected with two grounded gate NMOS transistors and pin A is protected with only one.
Figure 4:
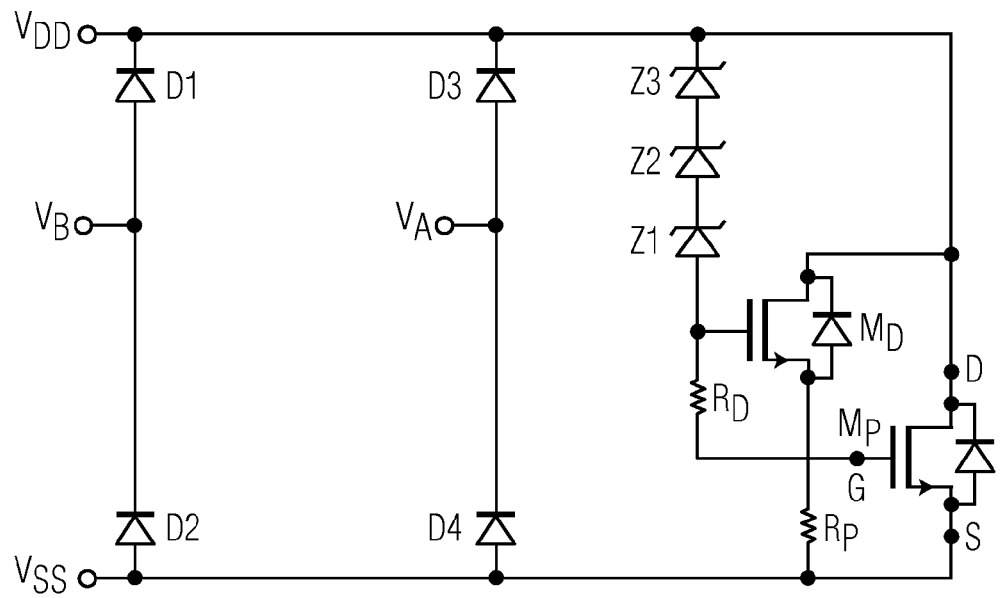
FIG. 4 shows a schematic circuit of a prior art supply rail based ESD protection circuit with clamp circuit.

The detailed description of an embodiment of the present invention is started with an explanation of the ESD protection circuit with active clamp circuit of FIG. 4. This circuit is known art, but serves as an introduction to the improved trigger circuit of the present invention. The circuit comprises a central ESD protection transistor $M_P$, which is configured as a lateral n-type DMOS transistor with a breakdown voltage $BV_{DS}$ that is higher than the required clamp voltage between any of the pins. This transistor $M_P$ is connected with its drain D to the positive supply rail $V_{DD}$ and with its source S to the negative supply rail $V_{SS}$. The control input of the ESD protection transistor $M_P$, i.e. its gate G, is connected to trigger voltage setting circuit. In its simplest embodiment the trigger voltage setting circuit comprises a resistor $R_P$ that is connected between the source S and the gate G of transistor $M_P$ and is also connected (via zener diodes) to the positive supply rail $V_{DD}$. However, in the present embodiment the trigger-voltage setting-circuit further comprises a driver transistor $M_D$ that is used to force a trigger current $I_T$ through resistor $R_P$ in order to turn transistor $M_P$ on when necessary, i.e. in case of ESD events. The driver transistor $M_D$ itself is driven the same way with the trigger current $I_T$ flowing through a resistor $R_D$ that is connected between the source and the gate G of transistor $M_D$. The trigger current $I_T$ required to switch on the driver transistor $M_D$ and the power transistor $M_P$ may be delivered by various parts of the trigger voltage setting circuit, dependent on the pins involved in an ESD event, for instance, by one ore more zener diodes as will be explained below. All non-power supply pins, i.e. pins $V_A$ and $V_B$, are connected with a diode D1, D3 (or a stack of diodes) to the positive supply line $V_{DD}$ where the anodes of the diodes D1, D3 are connected to the respective pin $V_A$, $V_B$ and the cathodes of the diodes D1, D3 are connected to the positive supply line $V_{DD}$. In similar way the pins $V_A$, $V_B$ are connected with diodes D2, D4 to the negative supply line $V_{SS}$ with the cathodes of the diodes D2, D4 being connected to the pins $V_A$, $V_B$ and the anodes to the negative supply line $V_{SS}$. These diodes D1 to D4 connected to the pins $V_A$, $V_B$ form part of an ESD current path and therefore must have the necessary dimensions to conduct the ESD current pulses $I_E$. This means that the diodes D1 to D4 must have a breakdown voltage that is higher than the clamp voltage corresponding with the pins on anode and cathode. For an ESD event between the supply pins $V_{DD}$ and $V_{SS}$, a simple stack of zener diodes Z1, Z2, Z3 between the positive supply pin $V_{DD}$ and the gate of the driver transistor $M_D$ is now sufficient to generate a "trigger" current $I_T$ to switch on driver transistor $M_D$ and central ESD protection transistor $M_P$. The clamp voltage is now determined by the sum of the zener voltages of the zener diodes Z1 to Z3 and the two threshold voltages of transistors $M_D$ and $M_P$. As soon as an ESD current pulse $I_E$ between the supply pins $V_{DD}$ and $V_{SS}$ causes the voltage between said pins to exceed this value, the power transistor $M_P$ is switched on and will conduct the ESD current $I_E$ and thus preventing further voltage increase.

Figure 5:
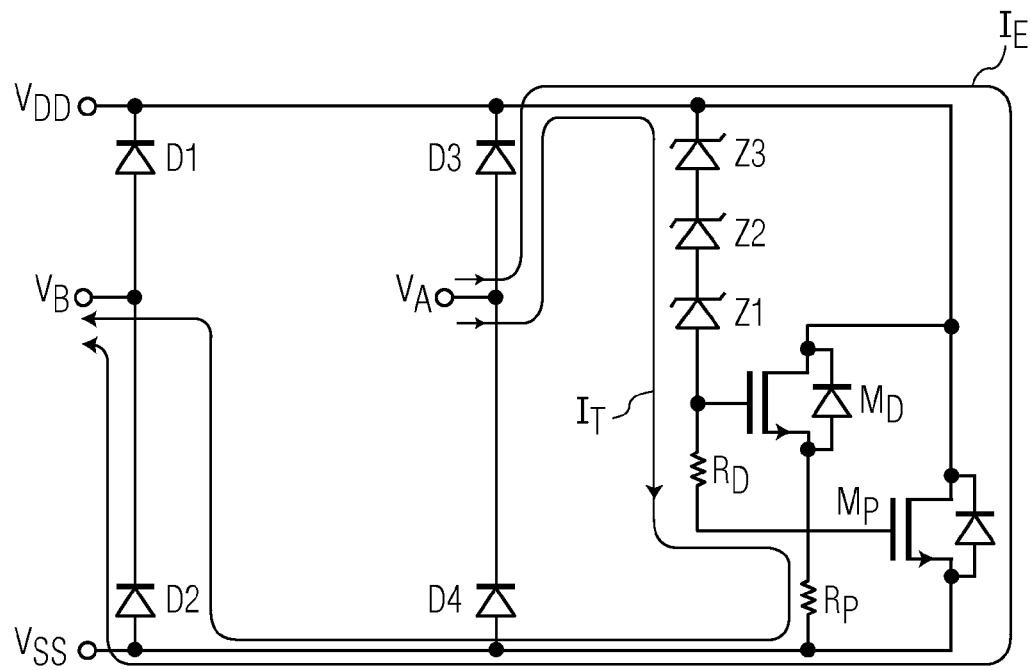
FIG. 5 shows the current flow in the supply rail based ESD protection circuit of FIG. 4 during an ESD event between the pins $V_A$ and $V_B$.

FIG. 5 shows the path of the "trigger" current $I_T$ that switches on driver transistor $M_D$ and eventually ESD protection transistor $M_P$. The trigger current $I_T$ forms a part of the total current flowing through the circuit in case of and ESD event. The other part of the total current is the ESD current $I_E$ that flows through the power transistor $M_P$. In the circuit in FIG. 5, the clamp voltage level between pins $V_A$, $V_B$ is almost equal to the clamp voltage between the supply pins $V_{DD}$, $V_{SS}$ (strictly speaking two diode forward voltages higher, namely the forward voltages of diodes D1 and D4 or diodes D3 and D2, respectively).

Figure 6:
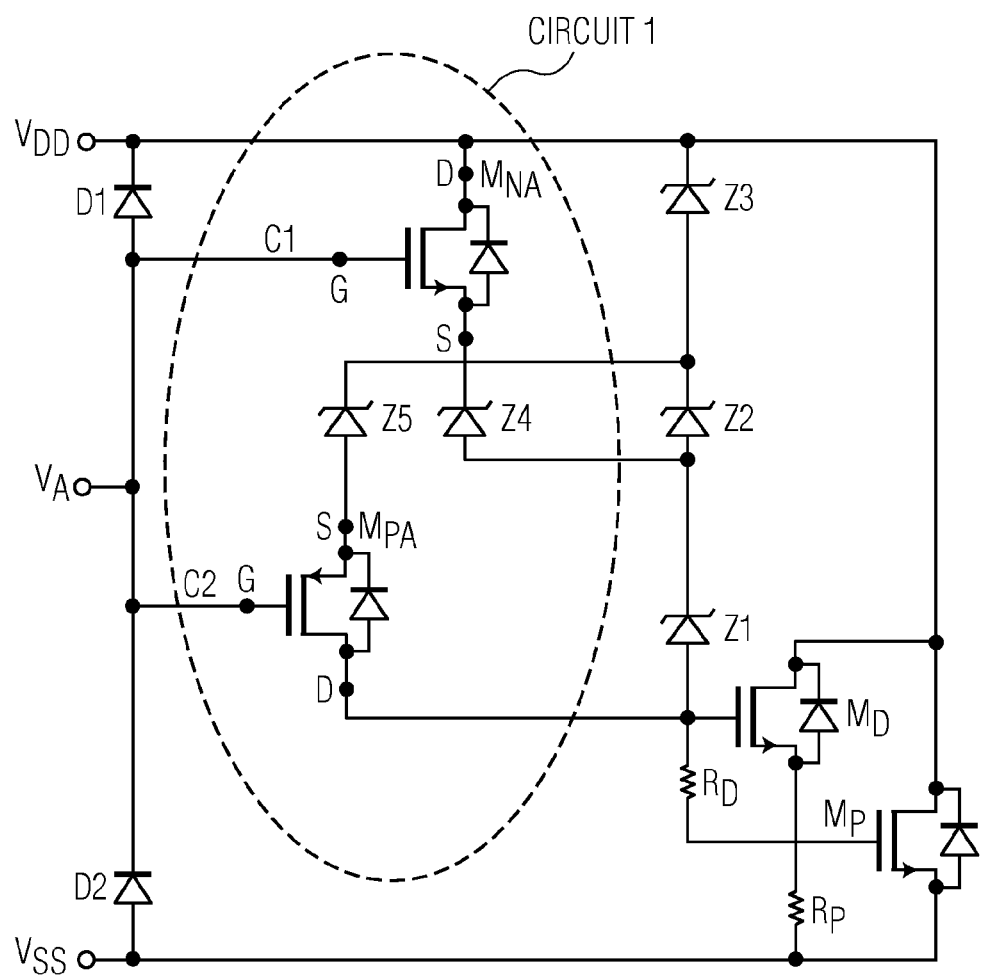
FIG. 6 shows a schematic circuit of a supply rail based ESD protection circuit with a pin specific clamp voltage according to the present invention.

While this known ESD protection circuit of FIG. 4 suffices for applications where all pins need to be clamped at essentially the same level it fails in cases where a pin needs to be clamped at a different voltage level. This problem, however, is solved by the present invention by adding a pin specific trigger circuit as shown in FIG. 6. By this measure the present invention renders pin specific protection devices or pin specific clamp circuits superfluous. The circuit of FIG. 6 is based on the circuit of FIG. 4 but has the pin specific trigger circuit 1 according to the present invention. The same components in the circuits of FIG. 4 and FIG. 6 are designated with the same numerals and instead of explaining them once more it is referred to the above description of the circuit of FIG. 4. For the ease of simplicity the pin VB and its protection diodes D3, D4 have been removed in FIG. 6. It should, however, be observed that the number of pins is not limited in any way by the present invention.

The pin specific trigger circuit 1 comprises a first electronic switching device $M_{NA}$, e.g. being configured as an n-type DMOS transistor. The first switching device $M_{NA}$ is connected with its drain D to the supply line $V_{DD}$ and with its source S to the cathode of a zener diode Z4. A control line C1 connects pin $V_A$ with the gate G of the first switching device $M_{NA}$. Thereby, the state (open or closed) of the first electronic switching device $M_{NA}$ is controlled depending on the voltage being present at pin $V_A$. The anode of the zener diode Z4 is connected between the cathode of zener diode Z1 and the anode of zener diode Z2.

The pin specific trigger circuit 1 further comprises a second electronic switching device $M_{PA}$, e.g. being configured as a p-type DMOS transistor. The second switching device $M_{PA}$ is connected with its drain D to the gate of the driver transistor $M_D$ and with its source S to the anode of a zener diode Z5. A control line C2 connects pin $V_A$ with the gate G of the second switching device $M_{PA}$. Thereby, the state (open or closed) of the second electronic switching device $M_{PA}$ is controlled depending on the voltage being present at pin $V_A$. The cathode of the zener diode Z5 is connected between the cathode of zener diode Z2 and the anode of zener diode Z3.

Due to the pin specific trigger circuit 1 the clamp voltage is dependent on the pins involved in an ESD event. The clamp voltage between the supply pins $V_{DD}$ and $V_{SS}$ is roughly $3*V_Z$, where $V_Z$ is the zener voltage of the stacked zener diodes Z1 to Z3. The clamp voltage between pins $V_A$ and $V_{SS}$, or between pins $V_{DD}$ and $V_A$, is only $2*V_Z+V_T$, where $V_T$ is the threshold voltage of electronic switching devices $M_{NA}$ or $M_{PA}$.

Figure 7A:
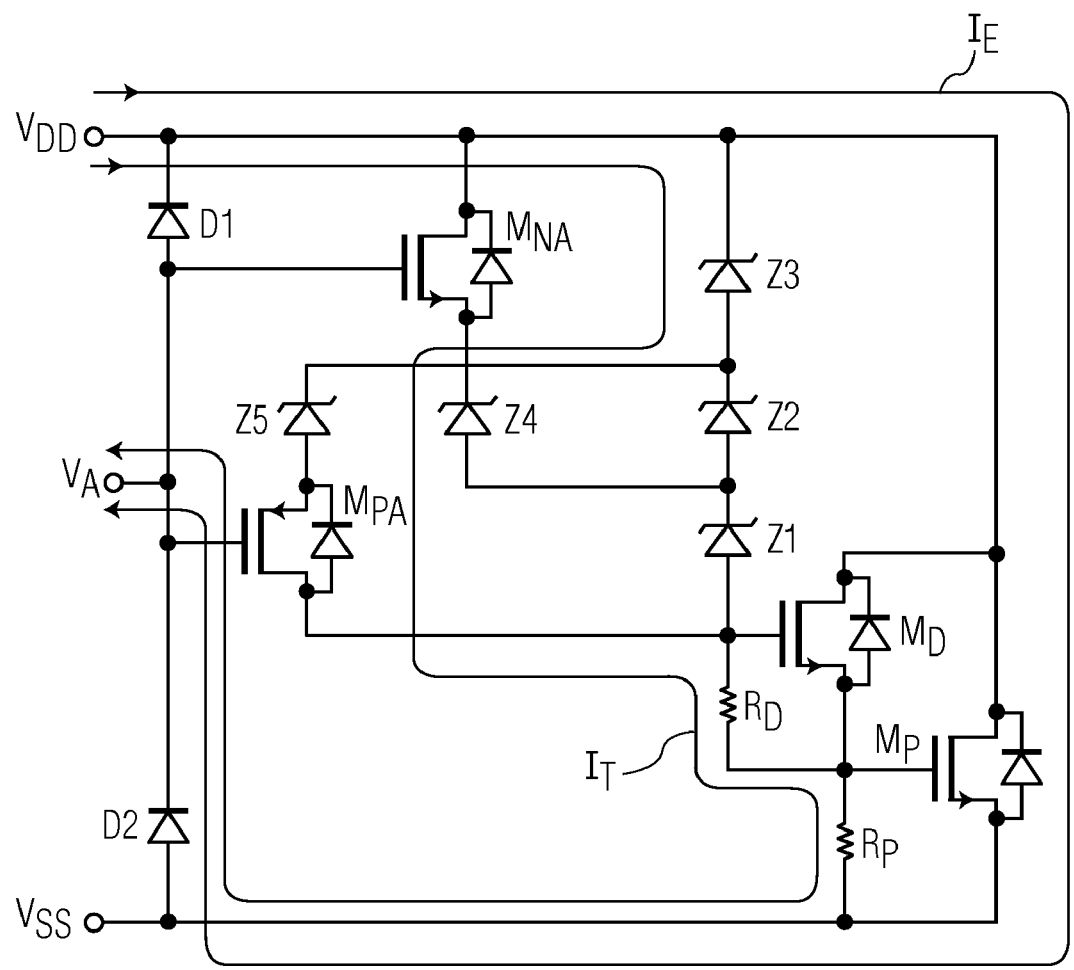
FIG. 7A illustrates a trigger current and an ESD current from pin $V_{DD}$ to pin $V_A$ in the supply rail based ESD protection circuit with a pin specific clamp voltage according to FIG. 6.

FIG. 7A illustrates the flow of a trigger current $I_T$ and an ESD current $I_E$ in case of an ESD event between pin $V_{DD}$ and pin $V_A$. The trigger current $I_T$ flows from pin $V_{DD}$ through zener diode Z3, zener diode Z5, the second switching device $M_{PA}$, resistors $R_D$ and $R_P$ and diode D2 to pin $V_A$. The ESD current $I_E$ flows from pin $V_{DD}$ through the central ESD protection transistor $M_P$ and diode D2 to pin $V_A$.

Figure 7B:
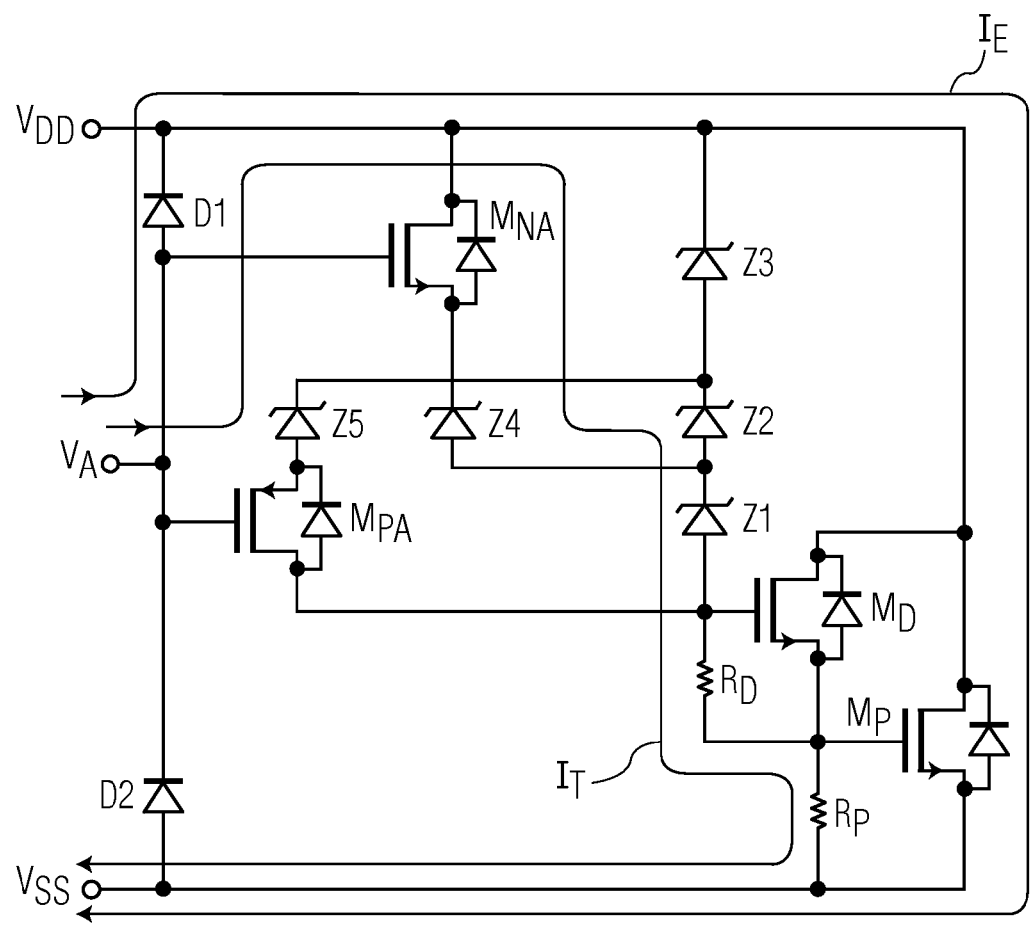
FIG. 7B illustrates a trigger current and an ESD current from pin $V_A$ to pin $V_{SS}$ in the supply rail based ESD protection circuit with a pin specific clamp voltage according to FIG. 6.

FIG. 7B illustrates the flow of a trigger current $I_T$ and an ESD current $I_E$ in case of an ESD event between pin $V_A$ and pin $V_{SS}$. The trigger current $I_T$ flows from pin $V_A$ through diode Z1, the first switching device $M_{NA}$, zener diode Z4, zener diode Z1, resistors $R_D$ and $R_P$ to pin $V_{SS}$. The ESD current $I_E$ flows from pin $V_A$ through diode D1 and the central ESD protection transistor $M_P$ to pin $V_{SS}$.

Figure 7C:
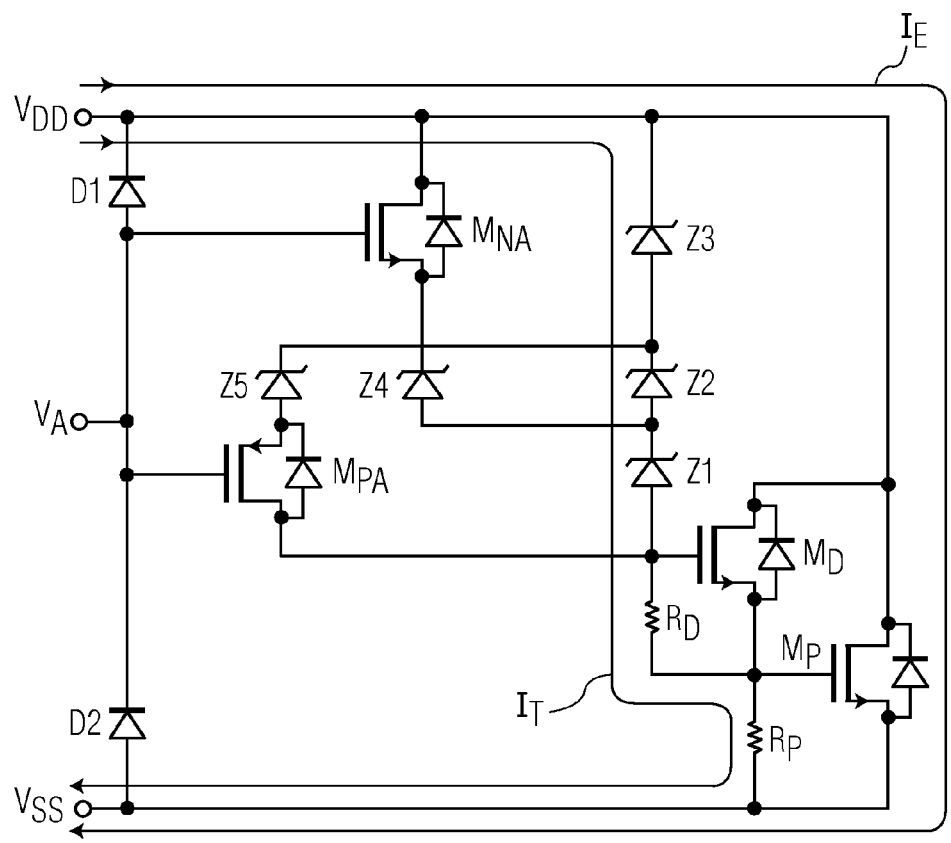
FIG. 7C illustrates a trigger current and an ESD current from pin $V_{DD}$ to pin $V_{SS}$ in the supply rail based ESD protection circuit with a pin specific clamp voltage according to FIG. 6.

FIG. 7C illustrates the flow of a trigger current $I_T$ and an ESD current $I_E$ in case of an ESD event between supply rail pins $V_{DD}$ and $V_{SS}$. The trigger current $I_T$ flows from pin $V_{DD}$ through the stack of zener diodes Z3, Z2, Z1, resistors $R_D$ and $R_P$ to pin $V_{SS}$. The ESD current $I_E$ flows from pin $V_{DD}$ through the central ESD protection transistor $M_P$ to pin $V_{SS}$.

Figure 8:
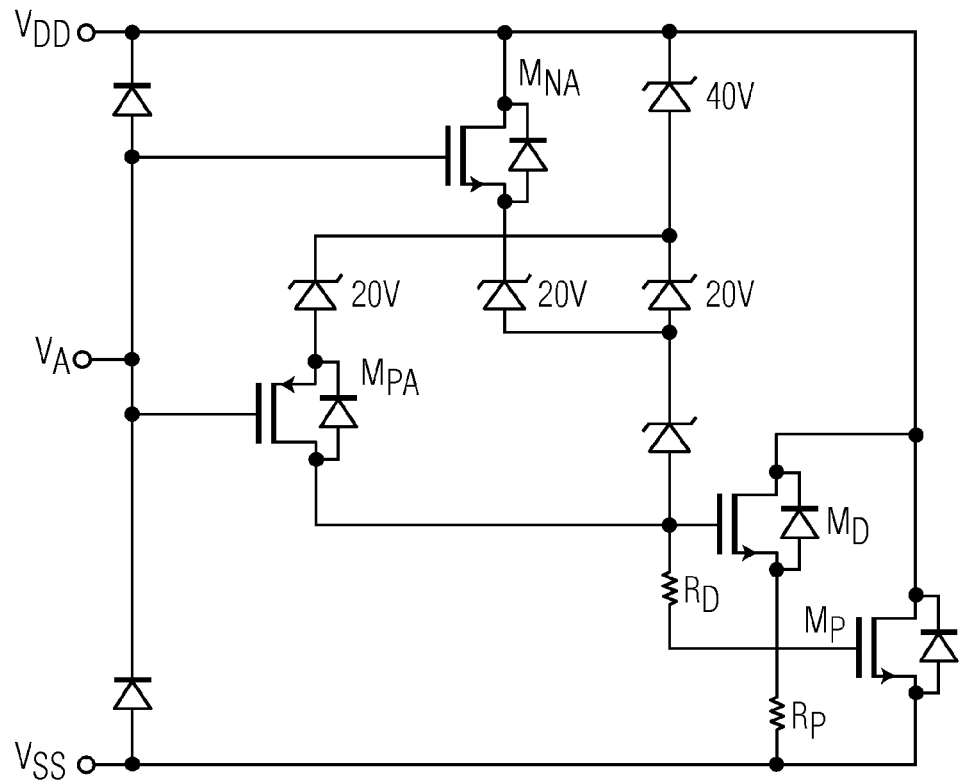
FIG. 8 shows the circuit of FIG. 6 with indicated zener voltages of the specifically selected zener diodes as used herein in experiments and simulations.

An embodiment of the invention has been simulated according to the circuit shown in FIG. 8 for both steady state conditions and transient situations. For steady state simulations a current source was connected between the pins that were tested and the resulting I-V characteristics was simulated. For the transient situations a current pulse of 1 μs was applied and the voltage response was simulated. This situation corresponds with a transmission line measurement set up. FIG. 8 shows the circuit of FIG. 6 with indicated zener voltages of the zener diodes selected for the experiments and simulations.

Figure 9:
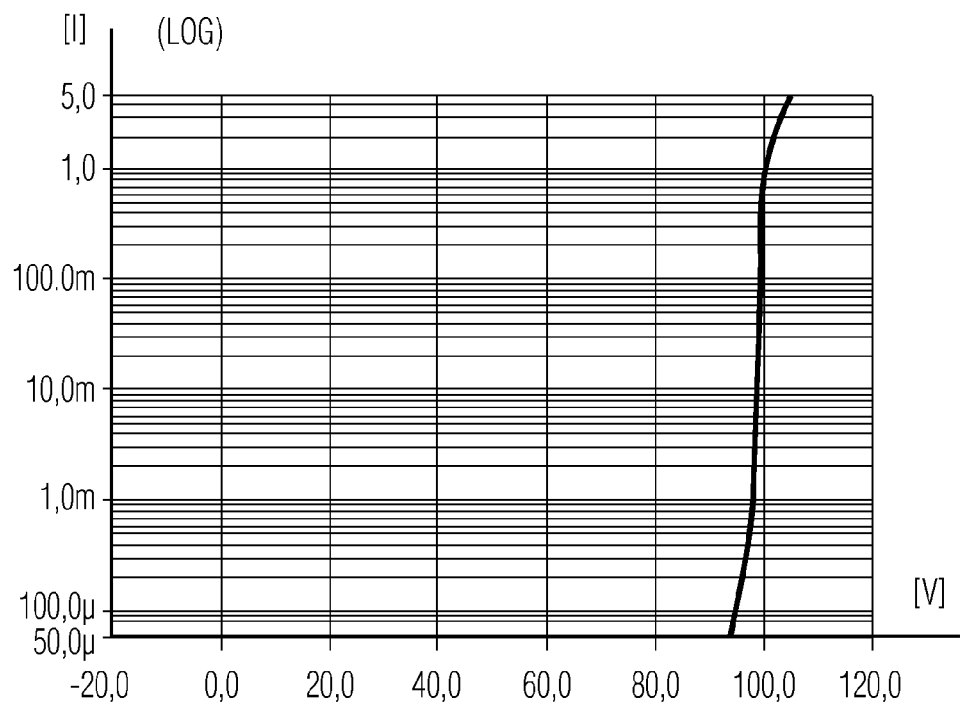
FIG. 9 shows a steady state I-V characteristic between VDD pin and VSS pin in the circuit according to FIG. 8.
Figure 10:
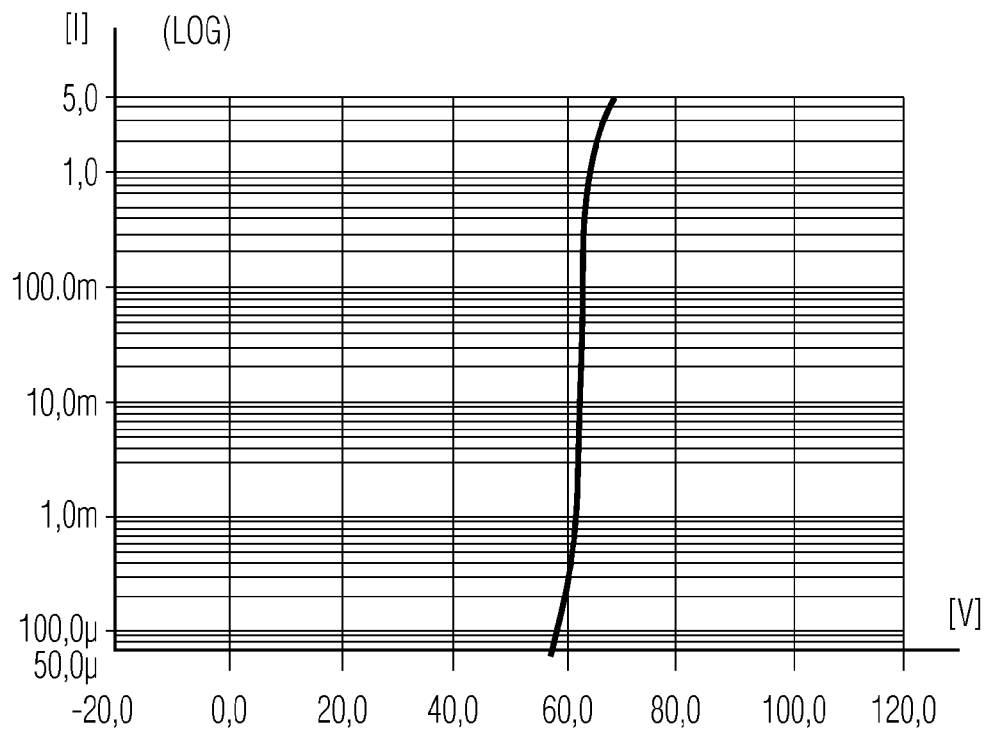
FIG. 10 shows a steady state I-V characteristic between VA pin and VSS pin in the circuit according to FIG. 8.
Figure 11:
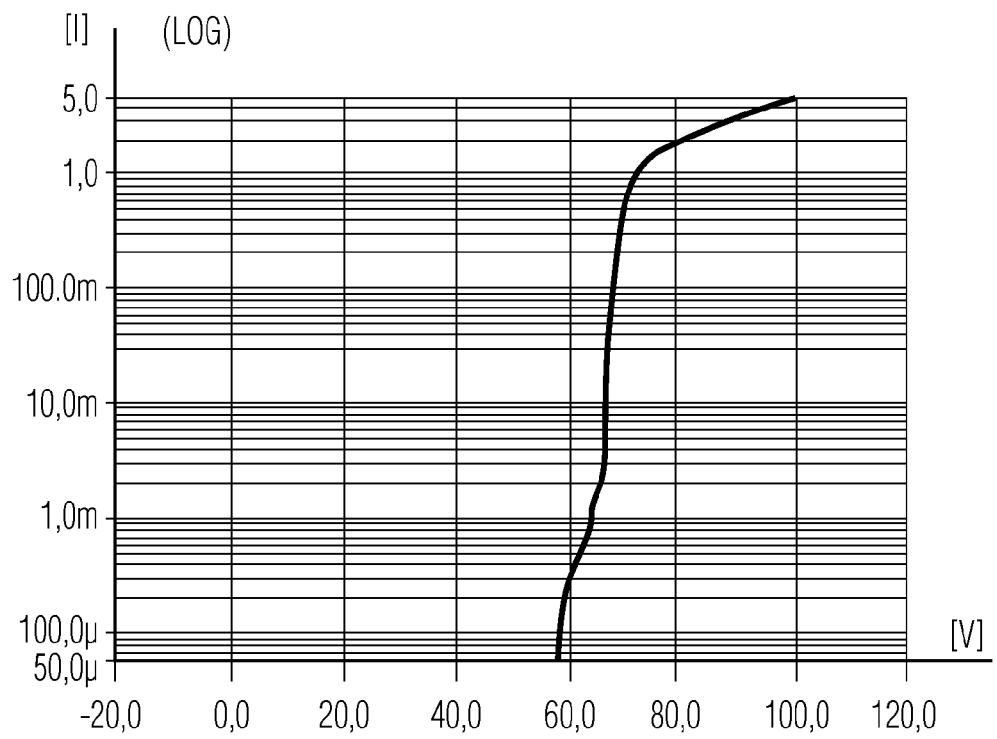
FIG. 11 shows a steady state I-V characteristic between VDD pin and VA pin in the circuit according to FIG. 8.

FIG. 9 shows a steady state I-V characteristic between VDD pin and VSS pin. FIG. 10 shows a steady state I-V characteristic between VA pin and VSS pin. FIG. 11 shows a steady state I-V characteristic between VDD pin and VA pin.

Figure 12:
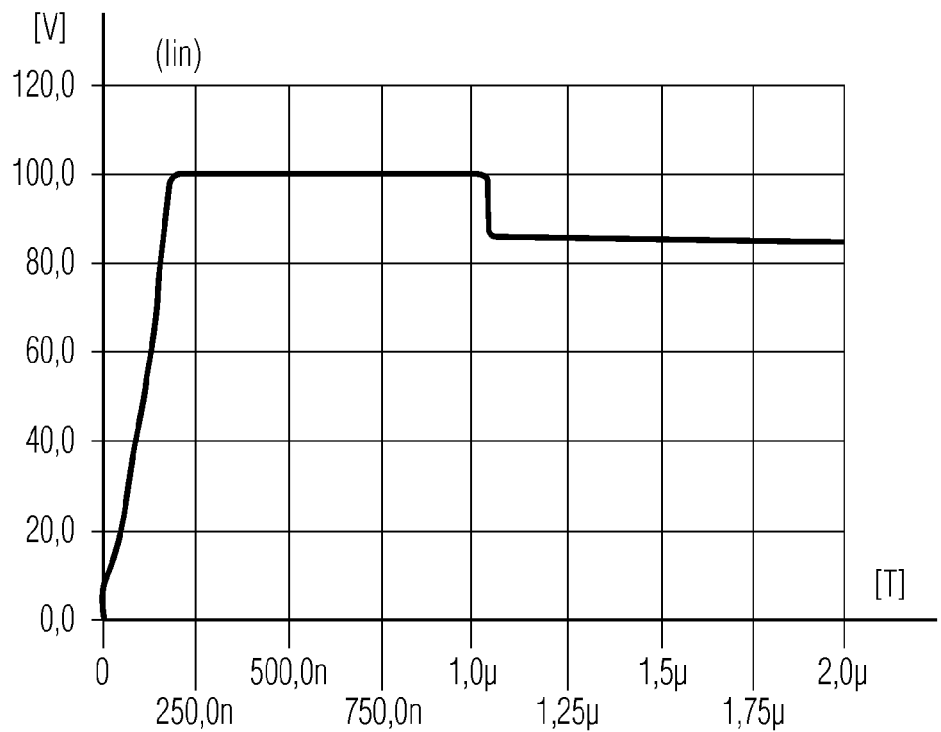
FIG. 12 shows a transient voltage response to a current pulse of 1 A, 1 µs between VDD pin and VSS pin in the circuit according to FIG. 8.
Figure 13:
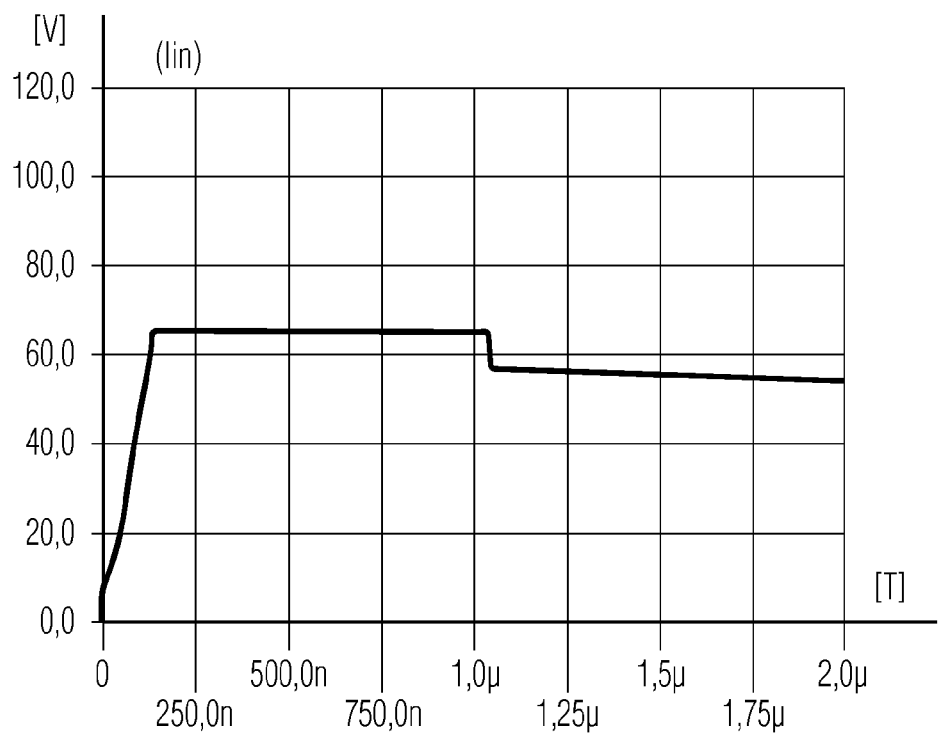
FIG. 13 shows a transient voltage response to a current pulse 1 A, 1 µs between VA pin and VSS pin in the circuit according to FIG. 8.
Figure 14:
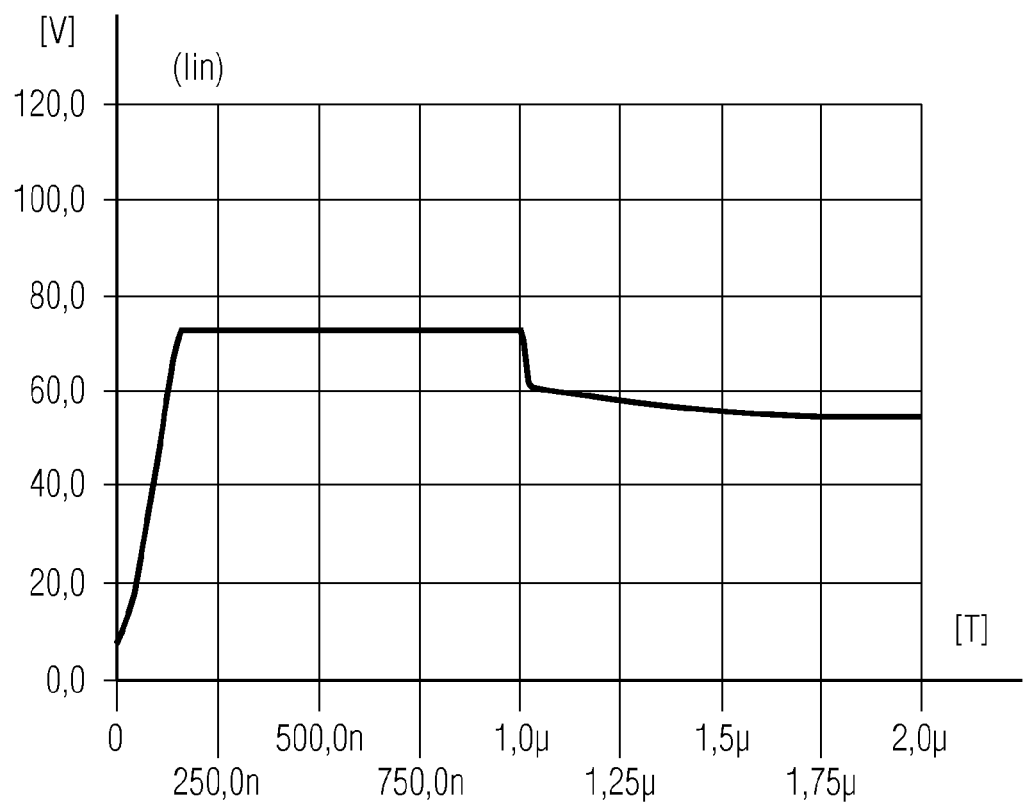
FIG. 14 shows a transient voltage response to a current pulse of 1 A, 1 µs between VDD pin and VA pin in the circuit according to FIG. 8.

FIG. 12 shows a transient voltage response to a current pulse of 1 A, 1 μs between VDD pin and VSS pin. FIG. 13 shows a transient voltage response to a current pulse 1 A, 1 μs between VA pin and VSS pin. FIG. 14 shows a transient voltage response to a current pulse of 1 A, 1 μs between VDD pin and VA pin.

The invention may be used in all integrated circuits with a supply rail based protection circuit where pin specific ESD protection voltages are required, e.g. in class-d audio power amplifier ICs. The present invention is particularly useful to reduce the requirements on the breakdown voltages of transistors that are not directly connected between the supply pins.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The indefinite article "a" or "an" preceding an element does not exclude the presence of a plurality of such elements. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A circuit comprising:
   a first supply line, a second supply line, and an electro static discharge (ESD) protection device connected between the first and second supply lines; and
   at least one pin connected to the first and second supply lines via diodes;
   wherein the ESD protection device comprises a trigger circuit connected to the at least one pin, wherein the trigger circuit provides a first pin specific trigger voltage and a second pin specific trigger voltage;

wherein the first pin specific trigger voltage occurs between the at least one pin and the first supply line, and the second pin specific trigger voltage occurs between the at least one pin and the second supply line;

wherein the first pin specific trigger voltage and the second pin specific trigger voltage are set by a trigger-voltage setting-circuit, wherein the trigger circuit is further connected to the trigger-voltage setting-circuit.

2. The circuit as claimed in claim 1, wherein the trigger circuit comprises a plurality of electronic switching devices controllable by a voltage applied to the at least one pin, wherein the electronic switching devices are connected in parallel to portions of the trigger-voltage setting-circuit.

3. The circuit as claimed in claim 2, wherein the portions of the trigger-voltage setting-circuit to which the electronic switching devices are connected in parallel comprise at least one zener diode.

4. The circuit as claimed in claim 2, wherein the trigger circuit further comprises at least one zener diode, wherein the zener diode is serially connected to at least one of the plurality of electronic switching devices and to the trigger-voltage setting-circuit.

5. The circuit as claimed in claim 2, wherein the plurality of electronic switching devices comprise a first transistor and a second transistor.

6. The circuit as claimed in claim 5, wherein a drain of the first transistor is connected to the first supply line, a gate of the first transistor is connected to the at least one pin, and a source of the first transistor is connected to a cathode terminal of a zener diode, wherein an anode terminal of the zener diode is connected to the trigger-voltage setting-circuit.

7. The circuit as claimed in claim 5, wherein a drain of the second transistor is connected to a resistor, a gate of the second transistor is connected to the at least one pin, and a source of the second transistor is connected to an anode of a zener diode, wherein a cathode of the zener diode is connected to the trigger-voltage setting-circuit.

8. The circuit as claimed in claim 1, wherein the first pin specific trigger voltage is different from the second pin specific trigger voltage.

9. The circuit as claimed in claim 1, wherein the trigger-voltage setting-circuit sets a supply trigger voltage, wherein the supply trigger voltage occurs between the first supply line and the second supply line.

* * * * *